United States Patent
Lei

(10) Patent No.: US 10,854,497 B2
(45) Date of Patent: Dec. 1, 2020

(54) APPARATUS AND METHOD OF SELECTIVE TURNING OVER A ROW OF SUBSTRATES IN AN ARRAY OF SUBSTRATES IN A PROCESSING SYSTEM

(71) Applicant: Lawrence Chung-Lai Lei, Milpitas, CA (US)

(72) Inventor: Lawrence Chung-Lai Lei, Milpitas, CA (US)

( * ) Notice: Subject to any disclaimer, the term of this patent is extended or adjusted under 35 U.S.C. 154(b) by 64 days.

(21) Appl. No.: 15/905,742

(22) Filed: Feb. 26, 2018

(65) Prior Publication Data
US 2018/0282864 A1    Oct. 4, 2018

(30) Foreign Application Priority Data
Mar. 28, 2017    (CN) .......................... 2017 1 0193707

(51) Int. Cl.
*B65G 47/248*    (2006.01)
*H01L 21/687*    (2006.01)
*H01L 21/677*    (2006.01)

(52) U.S. Cl.
CPC .. *H01L 21/68728* (2013.01); *H01L 21/67778* (2013.01); *B65G 47/248* (2013.01)

(58) Field of Classification Search
CPC ............ B65G 47/90; B65G 2201/0297; B65G 47/248; B25J 15/0052; H01L 21/68707; H01L 31/075; H01L 31/1876; C23C 16/4583; Y10S 414/136
USPC .................................................. 414/936, 941
See application file for complete search history.

(56) References Cited

U.S. PATENT DOCUMENTS

| | | | | |
|---|---|---|---|---|
| 797,121 | A * | 8/1905 | Keller ................... | C21D 9/0025 266/274 |
| 3,760,966 | A * | 9/1973 | Jones, Jr. ................. | B66F 9/18 414/785 |
| 4,284,301 | A * | 8/1981 | Geiger ..................... | B65H 5/08 271/268 |
| 4,573,863 | A * | 3/1986 | Picotte ................. | B65G 47/252 198/403 |

(Continued)

FOREIGN PATENT DOCUMENTS

TW    I661513 B    6/2019

OTHER PUBLICATIONS

Chinese Office Action dated Aug. 23, 2018 of counter-part Chinese Application No. 107110291.
(Continued)

*Primary Examiner* — Gregory W Adams
(74) *Attorney, Agent, or Firm* — Vista IP Law Group, LLP

(57) ABSTRACT

A device for manipulating at least a first row of wafers and a second row of wafers, includes: a first holder configured to hold the first row of wafers, the first holder having a first rod and a second rod, the first rod and the second rod of the first holder defining a space therebetween for accommodating the first row of wafers, wherein a distance between the first rod and the second rod of the first holder is variable; and a second holder configured to hold the second row of wafers, the second holder having a first rod and a second rod, the first rod and the second rod of the second holder defining a space therebetween for accommodating the second row of wafers, wherein a distance between the first rod and the second rod of the second holder is variable.

25 Claims, 7 Drawing Sheets

(56) References Cited

U.S. PATENT DOCUMENTS

| | | | |
|---|---|---|---|
| 5,686,143 A * | 11/1997 | Matsukawa | B08B 1/007 427/271 |
| 6,874,515 B2 | 4/2005 | Ishihara | B08B 1/04 134/140 |
| 7,322,787 B2 * | 1/2008 | Hashimoto | H01L 21/68707 414/754 |
| 7,401,828 B2 * | 7/2008 | Yang | B65G 49/061 294/119.1 |
| 7,751,939 B2 * | 7/2010 | Cho | B25J 9/1638 318/568.11 |
| 7,878,213 B2 * | 2/2011 | Mitsuyoshi | B65G 49/061 134/133 |
| 7,926,441 B2 * | 4/2011 | Tsutsumi | H01L 21/67051 118/300 |
| 8,181,767 B2 * | 5/2012 | Gales | A21C 9/08 198/404 |
| 8,297,908 B2 * | 10/2012 | Savoia | B65G 47/252 198/403 |
| 8,444,368 B2 * | 5/2013 | Irie | B65G 49/061 414/744.3 |
| 8,465,072 B2 * | 6/2013 | Wu | B65G 49/067 294/213 |
| 8,550,765 B2 * | 10/2013 | Cottone | B65G 49/061 414/744.3 |
| 8,703,583 B2 * | 4/2014 | Maki | H01L 21/67092 257/E21.237 |
| 8,770,580 B2 * | 7/2014 | Jakob | B65H 31/32 271/218 |
| 8,814,239 B2 * | 8/2014 | Forderhase | H01L 21/67046 294/213 |
| 8,919,358 B2 * | 12/2014 | Mitsuyoshi | H01L 21/67201 134/134 |
| 9,087,866 B2 * | 7/2015 | Jheong | B65G 65/00 |
| 9,126,297 B2 * | 9/2015 | Miyamoto | H01L 21/67742 |
| 9,381,653 B2 * | 7/2016 | Kim | B25J 11/0095 |
| 9,387,584 B2 * | 7/2016 | Yazawa | B25J 21/00 |
| 2004/0197184 A1 * | 10/2004 | Sugiyama | B65G 49/061 414/758 |
| 2004/0240979 A1 * | 12/2004 | Beavers | B25J 15/0253 414/788 |
| 2007/0017445 A1 * | 1/2007 | Takehara | C23C 14/568 118/719 |
| 2008/0279658 A1 * | 11/2008 | Bachrach | B25J 15/0052 414/222.01 |
| 2010/0087028 A1 | 4/2010 | Porthouse et al. | |
| 2012/0031438 A1 * | 2/2012 | Jheong | B65G 65/00 134/32 |
| 2013/0209198 A1 | 8/2013 | Forderhase et al. | |
| 2015/0050113 A1 * | 2/2015 | Cugnoni | B65H 31/32 414/790.8 |

OTHER PUBLICATIONS

Non-Final Office Action dated Jan. 7, 2020 for U.S. Appl. No. 15/872,915.

* cited by examiner

APPARATUS AND METHOD OF SELECTIVE TURNING OVER A ROW OF SUBSTRATES IN AN ARRAY OF SUBSTRATES IN A PROCESSING SYSTEM

RELATED APPLICATION DATA

This application claims priority to, and the benefit of, Chinese Patent Application No. 201710193707.2 filed Mar. 28, 2017, pending. The entire disclosure of the above application is expressly incorporated by reference herein.

FIELD

This disclosure relates to the technical field of substrate processing.

BACKGROUND

For substrates such as photovoltaic solar cell substrates that need to be treated on both the front and back surfaces, the substrate needs to be turned over after the front surface of the substrate is processed so that the back surface can be processed. The existing substrate turnover device is typically situated outside the substrate processing system in atmosphere. Since most solar processing system requires a substrate bearing plate to hold the substrates and processed at elevated temperature and reduced pressure, after one surface treatment is completed, the substrate bearing plate needs to be cooled and conveyed to a devise outside the substrate processing system where each substrate is lifted off the substrate bearing plate and turned over before being placed onto a different substrate bearing plate to be processed on a second processing system. Cross contamination is the main cause of poor performance of the cell so switching the substrate bearing plate is critical to achieve high efficiency and yield. In order for substrates to be transferred from bearing plate to another bearing plate, and also being able to turn over the substrate between the bearing plates, vacuum suction is often used which requires the substrate to be flat and cool. After the turning over of the substrates, the bearing plate and substrates must be reheated to process temperature prior to treatment of the second surface. This way, the substrates are subjected to a series of heating and cooling and vacuum handling on and off the bearing plates. The high mass of the substrate bearing plate also means more energy is used in the production of the solar cell and reduced the energy efficiency in the making of solar cells.

SUMMARY

In order for the substrate to be turned over in the substrate processing system, this disclosure provides a substrate turnover devise and method. The disclosure further provides a substrate processing system comprising the substrate turnover device.

In order to provide a solution, the following approach is adopted:

The substrate turnover device is characterized: the substrate comprises a plurality of wafers arranged in rows and columns, wherein the substrate turnover device comprises, a plurality of lifting columns capable of moving up and down and an edge clamping device used for clamping the edge of the wafers, the plurality of lifting columns correspond to a plurality of wafers to be borne, and the surface of the lifting column is smaller than the surface of the wafer, each lifting column moves up and down to drive a wafer placed on top of the lifting column The wafer holder comprises a plurality of clamping devices, each clamping device comprises a plurality of clamping rods which are oppositely arranged up and down, the plurality of clamping rods which are oppositely arranged up and down are used for clamping the edge areas of the upper and lower surfaces of a row of wafers.

The plurality of clamping rods which are oppositely arranged in the vertical direction can move together in the vertical direction, or, and the plurality of clamping rods which are oppositely arranged in the vertical direction and the horizontal direction can move in the vertically opposed direction and the horizontally opposed directions.

Optionally, the plurality of lifting columns are arranged in rows, wherein the substrate turnover device further comprises a lifting column motion control part, the lifting column motion control component is used for controlling all the lifting columns, one row of lifting columns or a plurality of rows of lifting columns on non neighboring rows, in an up and down movement at the same time.

Optionally, the substrate turnover device further comprises a pedestal used for bearing the substrate, wherein the pedestal can be arranged to heat up the substrate bearing on it.

Optionally, the substrate turnover device further comprises a substrate conveying fork positioning component. The substrate conveying fork positioning component is used for positioning the free ends of the branches of the conveying fork, so that the substrate on the conveying fork and the corresponding substrate bearing column are aligned vertically.

Optionally, each of the clamping members is used for clamping a row of wafers, and the distance d between every two adjacent clamping parts is the width of the n wafers in the row direction, wherein n is a positive integer. (The clamp to clamp spacing can correspond to every alternate row of wafers or every $3^{rd}$ rows of wafers or every nth row of wafers).

The substrate processing system comprises a plurality of rows of wafers arranged in rows, each column of wafers comprises a plurality of wafers, the substrate processing system comprises a loading chamber and a conveying chamber, wherein the loading chamber is used for loading substrate, and the conveying chamber is used for conveying substrate, the process reaction chamber is used for substrate treatment, the turnover chamber is used for turning over substrate, and the unloading chamber is used for unloading substrate. The conveying chambers are respectively communicated with the loading and unloading chamber, the process reaction chambers, and the turnover chamber with an isolation valve being arranged in between the respective chambers.

The turnover chamber is provided with a substrate turnover device as described in any of the above embodiment.

Optionally, a substrate conveying device is arranged in the conveying chamber described above and comprises of: a conveying mechanical arm provided with a substrate conveying fork, the substrate conveying fork comprises a main body and a plurality of mutually parallel branches, one end of each branch is connected to the main body, and the other end of each branch is a free end; a plurality of grooves is formed in each of the branches, and the plurality of grooves in every two adjacent branches is oppositely arranged; each adjacent groove in each branch and the groove opposite to the adjacent groove form a wafer supporting structure.

Optionally, the side wall of the groove is a slope.

Optionally, the system further comprises a substrate loading device arranged at the front end of the loading chamber, wherein the substrate loading device and the substrate conveying device are similar in structure.

Optionally, the system further comprises a substrate unloading device arranged at the end of the unloading chamber, wherein the structure of the substrate unloading device is similar to the substrate conveying device.

The substrate turnover method is characterized such that it is based on any of the embodiment of substrate turnover devices described above and that the substrate turnover method comprises the following steps:

Step A: after the substrates are conveyed onto the lifting columns in the turnover chamber, and determining the column to which the current to-be-turned wafer belongs to; wherein the current to-be-turned wafer is a column of wafers on the non-adjacent columns.

Step B: controlling the current to-be-turned wafer and the non-current to-be-turned wafer corresponding lifting columns movement in the vertical direction, such that the current to-be-turned wafer and the non-current to-be-turned wafer are not on the same horizontal plane, and enabling the current to-be-turned wafer to be positioned between the clamping rods which are oppositely arranged in the up and down direction.

Step C: closing the wafer gripper, so that the upper and lower oppositely arranged clamping rods clamp the edge area of the upper surface and the lower surface of the current to-be-turned wafer respectively, controlling the lifting column corresponding to the current to-be-turned wafer to move downwards.

Step D: Rotate the current to-be-turned wafer clamped by the clamping rod by 180 degree.

Step E: opening the wafer edge clamping rods, so that the upper and lower oppositely arranged clamping rods move away from each other in the vertical direction, and lowering the wafer sitting on the lower clamping rods to a preset position, then controlling the lifting columns corresponding to the currently-turned wafers to move upwards, so that the currently-turned wafers are moved upward to a preset position between the upper and lower clamping rods. The set of clamping rods for each wafer are then moved away from each other in a horizontal position to clear themselves away the vertical movement of the currently-turned wafers. The corresponding lifting columns then move the turned wafers lower to a preset position or onto the pedestal.

Step F: from the columns of wafers which have not been turned over, determine which column will be turned over next.

Step G: repeat step B to F until all the columns of wafers have been turned over.

The substrate turnover method is characterized such that it is based on any of the embodiment of substrate turnover devices described above and that the substrate turnover method comprises the following steps:

Step A: after the wafers are conveyed to the lifting columns in the turnover chamber, and the lifting columns bearing the wafers are controlled to move in the vertical direction, so that the wafer placed on the lifting column is located between the clamping rods which are oppositely arranged up and down.

Step B: closing the edge grippers and enabling the upper and lower oppositely arranged clamping rods to clamp the edge regions of the upper surface and the lower surface of each wafer respectively.

Step C: controlling all the lifting columns mentioned in step B to move downwards.

Step D: controlling all the wafers clamped to turn over by 180 degrees.

Step E: move the clamping rods away from each other in the vertical directions and let the wafers which are sitting on the lower clamping rods to move downwards.

Step F: move the lifting columns upward to meet the turned over wafers and lifting them to a preset position.

Comparing with existing technology, one or more embodiments described herein have the following advantages:

According to the technical scheme presented above, the substrate processing system comprises a turnover chamber which is specially used for turning over substrates. When one surface of the substrate is processed, the substrate is conveyed to the turnover chamber by the substrate conveying device in the conveying chamber, the substrate turnover device in the turnover chamber can turnover substrates at a reduced pressure condition, and the substrates can then be conveyed to the process reaction chamber through the substrate conveying device in the conveying chamber. Treatment of the other surface of the substrate can be carried out in the process reaction chambers so that the substrate can complete the treatment of both surfaces without exposure to atmospheric conditions.

A device for manipulating a plurality of rows of wafers, includes: a plurality of columns configured to support respective ones of the wafers, wherein a supporting surface of one of the columns is smaller than a surface of one of the wafers; and a first holder configured to hold one of the rows of wafers, the first holder having a first rod and a second rod, the first rod and the second rod defining a space therebetween for accommodating the one of the rows of wafers; wherein a distance between the first rod and the second rod of the first holder is variable.

Optionally, each of the first rod and the second rod is configured to move in a direction that is parallel to a plane of the wafers in the one of the rows of wafers.

Optionally, the first holder further comprises a third rod and a fourth rod, the third rod and the fourth rod defining a space therebetween for accommodating the one of the rows of wafers.

Optionally, a second distance between the first rod and the third rod is variable.

Optionally, the first holder is configured to rotate the one of the rows of wafers to turn over the one of the rows of wafers.

Optionally, the device further includes a second holder configured to hold another one of the rows of wafers, the second holder having a first rod and a second rod, the first rod and the second rod of the second holder defining a space therebetween for accommodating the other one of the rows of wafers; wherein a distance between the first rod and the second rod of the second holder is variable; wherein the one of the rows of wafers and the other one of the rows of wafers are non-adjacent rows.

Optionally, the plurality of columns are arranged in rows, and wherein the device further comprises a movement control configured to selectively move all of the columns in all of the rows of columns simultaneously, move one row of the columns simultaneously, or move multiple non-adjacent rows of the columns simultaneously.

A processing system includes the device, and a heat source configured to provide heat to the rows of wafers.

A processing system includes: a vacuum chamber; and the device, wherein the device is located in the vacuum chamber.

A device for manipulating at least a first row of wafers and a second row of wafers, includes: a first holder configured to hold the first row of wafers, the first holder having a first rod and a second rod, the first rod and the second rod of the first holder defining a space therebetween for accommodating the first row of wafers, wherein a distance between the first rod and the second rod of the first holder is variable; and a second holder configured to hold the second row of wafers, the second holder having a first rod and a second rod, the first rod and the second rod of the second holder defining a space therebetween for accommodating the second row of wafers, wherein a distance between the first rod and the second rod of the second holder is variable.

Optionally, each of the first rod and the second rod of the first holder is configured to move in a direction that is parallel to a plane of the wafers in the first row of wafers.

Optionally, the first holder further comprises a third rod and a fourth rod, wherein a distance between the third rod and the fourth rod is variable, and wherein a distance between the first rod and the third rod is also variable.

Optionally, the first holder is configured to rotate the first row of wafers to turn over the first row of wafers.

Optionally, the first row of wafers and the second row of wafers are non-adjacent rows.

A processing system includes: the device; a fork having branches for supporting the first row of wafers and the second row of wafers; and a positioning device configured to position the fork.

A processing system includes: the device; a loading chamber for loading the first and second rows of wafers; a conveying chamber for conveying the first and second rows of wafers; one or more process reaction chambers for treating the first and second rows of wafers; a turnover chamber in which the device is located; and an unloading chamber for unloading the first and second rows of wafers.

A processing system includes: the device; a chamber; and a fork in the chamber, wherein the fork is configured to support the first row of wafers and the second row of wafers, the fork having a main body and a plurality of parallel branches, one end of each of the branches is connected to the main body, and another end of each of the branches is a free end; wherein each of the branches has a plurality of grooves; and wherein the grooves in a first one of the branches and the grooves in a second one of the branches are oppositely arranged with respect to each other to support the first row of wafers or the second row of wafers.

Optionally, one of the grooves in one of the branches is a part of a sloped side wall.

Optionally, the processing system further includes: a loading device arranged at a front end of a loading chamber; and an unloading device arranged at a rear end of an unloading chamber.

A processing system includes: a vacuum chamber; and the device, wherein the device is located in the vacuum chamber.

A method for manipulating at least a first row of wafers and a second row of wafers, includes: placing the first row of wafers and the second row of wafers in a vacuum chamber; turning over the first row of wafers while the first row of wafers is in the vacuum chamber; and turning over the second row of wafers while the second row of wafers is in the vacuum chamber.

Optionally, the act of turning over the first row of wafers comprises: providing a first holder having a first rod and a second rod; reducing a distance between the first rod and the second rod to allow the first holder to hold the first row of wafers; and rotating the first row of wafers using the first holder to thereby turn over the first row of wafers.

Optionally, the wafers in the first row are supported on respective columns in the vacuum chamber, and wherein the method further comprises creating a relative movement between the columns and the first holder to place the first row of wafers between the first rod and the second rod of the first holder.

Optionally, after the first holder holds the first row of wafers, and before the act of rotating is performed, the method further comprises creating a distance between the first row of wafers and the respective columns.

Optionally, the method further includes: increasing the distance between the first rod and the second rod after the act of rotating; and using the columns to support the turned over first row of wafers.

Optionally, the first row and the second row are adjacent rows, and the acts of turning are performed sequentially.

Optionally, when the first row of wafers is being turned, the second row of wafers is located at a different elevation from that of the first row of wafers.

Optionally, the first row and the second row are non-adjacent rows, and the acts of turning are performed simultaneously.

Other features, advantageous, and embodiments will be described in the detailed description.

DESCRIPTION OF THE FIGURES

In order to illustrate more clearly the technical solutions in the embodiments of the present disclosure, the accompanying drawings can used in the description of the embodiments. The accompanying drawings in the following description are only some of the embodiments described in the present disclosure, and persons of ordinary skills in the art will understand that the claimed invention is not limited to such descriptions. Without much creative effort, more designs or drawings can be generated from the accompanying drawings.

DETAILED DESCRIPTION

In order to enable a person skilled in the art to better understand the scheme of the claimed invention, the embodiments of the present disclosure are described below with reference to the accompanying drawings. The technical scheme in the embodiment of is clearly and completely described. Obviously, the described embodiments are only part of the embodiments of the present disclosure, and not all the embodiments. Based on the embodiments, persons of ordinary skill in the art without creative efforts can obtain more embodiments which are part of the scope of protection of the claimed invention.

It should be noted that the substrate in accordance with an embodiment comprises a plurality of wafers arranged in rows and each column of wafers also comprises a plurality of wafers.

Figure 1:
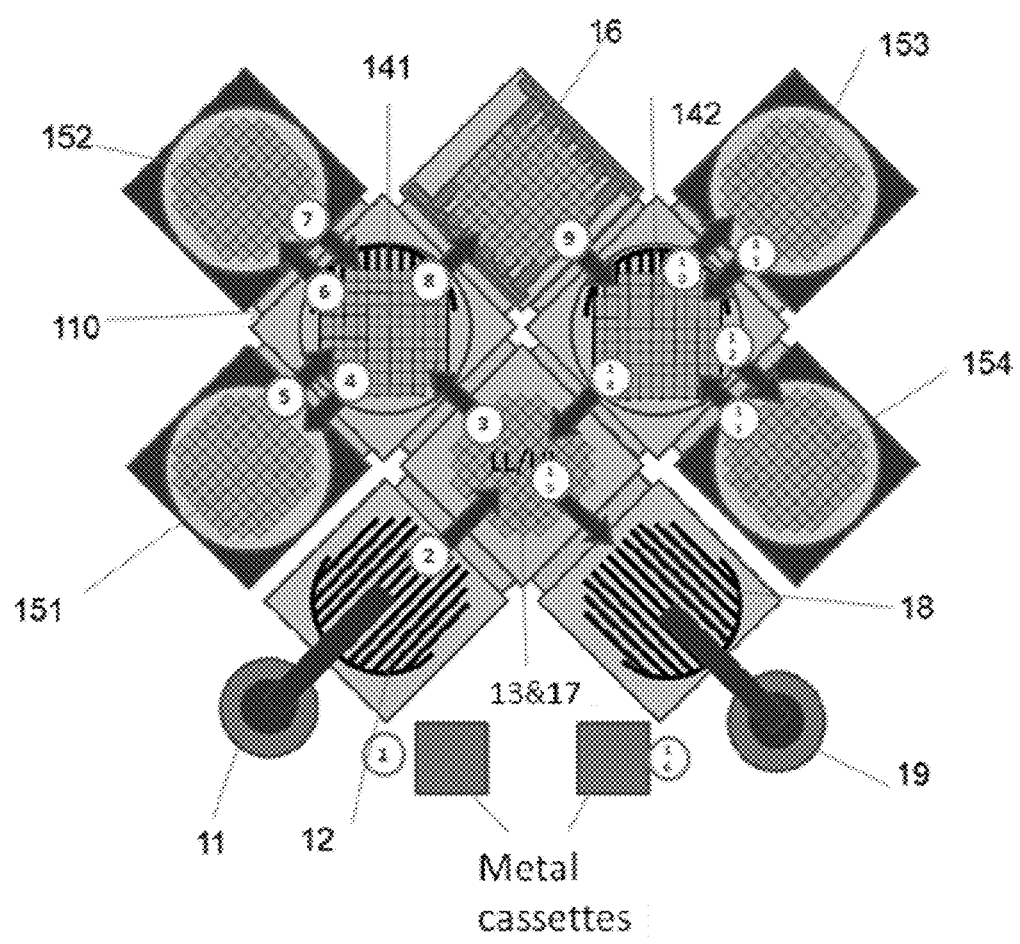
FIG. 1 is a schematic diagram of a substrate processing system according to an embodiment.

FIG. 1 is a schematic diagram of a substrate processing system according to an embodiment. As shown in FIG. 1, the substrate processing system comprises:

11. atmospheric loading robot
12. substrate loading device
13. substrate loading chamber
141. first conveying chamber
142 Second conveying chamber
151 First process reaction chamber
152 Second process reaction chamber
153 Third process reaction chamber
154. Fourth process reaction chamber
16 Substrate turnover chamber
17 Substrate unloading chamber
18 Substrate unloading device
19 Substrate unloading atmospheric robot A wafer bearing column for bearing each wafer of the substrate is arranged in each of the loading chamber 13 and the unloading chamber 17; the wafer bearing column is used for bearing a wafer; so that the number of wafers to be borne is at least equal to the number of wafer bearing columns arranged in the loading chamber 13 and the unloading chamber 16.

The substrate loading device is disposed at the front end of the loading chamber, and a substrate loading robot 11 is used to load substrate from a metal cassette box into the loading chamber 13. Specifically, the substrate loading robot 11 places the substrate onto the wafer bearing columns in the loading chamber 13.

The substrate unloading device 18 is arranged at the rear end of the unloading chamber 17, and is used for taking away the substrate from the wafer bearing column in the unloading chamber 17 and transporting the substrate to the substrate unloading robot 19, which places the wafers into metal wafer cassettes.

Isolation valves 110 are placed in between the following chambers: the loading chamber 13 and the first conveying chamber 141 which in tern connected with the first process reaction chamber 151, the second process reaction chamber 152, and the turnover chamber 16; the second conveying chamber 142 is respectively connected with the turnover chamber 16, the third process reaction chamber 153, the fourth process reaction chamber 154 and the unloading chamber 17.

As a specific embodiment, the inner shape of the first process reaction chamber 151, the second process reaction chamber 152, the third process reaction 153 and the fourth process reaction chamber 154 can be circular, so that plasma formed using radio frequency source can be more uniform. The circular shape also facilitates gas flow uniformity from center to the outer edges of the reactor.

In order to reduce the footprint of the substrate processing system, the embodiment prescribes that the loading chamber 13 and the unloading chamber 17 can be stacked on top of each other and rotated 90 deg with respect to each other. As another embodiment, the loading chamber 13 and the unloading chamber 17 can be placed horizontally and/or in parallel configuration.

Figure 2:
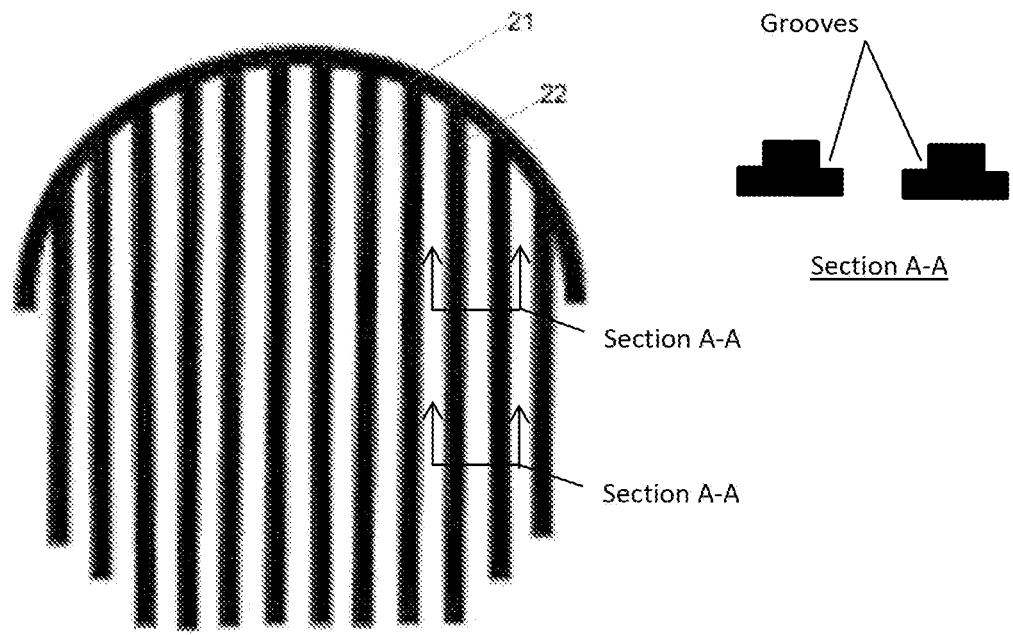
FIG. 2 is a structural diagram of a substrate conveying fork according to an embodiment.

The following describes the internal construction of the first conveying chamber 141 and the second conveying chamber 142:

In the substrate processing system, at least one set of substrate conveying device is arranged in each of the first conveying chamber 141 and the second conveying chamber 142. The substrate conveying device can directly transfer the substrate without the use of a substrate bearing plate. The substrate conveying device comprises a conveying mechanical arm. A substrate conveying fork is arranged on the conveying mechanical arm. The structure shape of the substrate conveying fork is shown in FIG. 2, the substrate conveying fork comprises a main body 21 and a plurality of mutually parallel branches 22, where one end of each branch 22 is connected to the trunk 21, and the other end is a free end. In general, the shape of the substrate arrangement is generally polygonal, square or circular, and can be matched with the shape of the conveying fork. In particular, the shape of the trunk 21 can be an arc-shaped main body.

Each of the branches 22 is provided with a plurality of grooves (not shown in FIG. 2); the plurality of grooves in every two adjacent branches is oppositely arranged.

Each adjacent groove in each fork 22 and the groove opposite to the adjacent groove form a wafer supporting structure for supporting a wafer. In this way, the groove in each branch supports the edge area of the same side of the wafer. The underside of the wafer not supported by the branch 22 allow a wafer bearing column or set of lifting columns to support the wafer and lift the wafer off the conveying fork during the conveying of substrate from one chamber to another.

The substrate supporting structure formed by the grooves in the adjacent branches enables the substrate to be captured firmly and securely in the substrate conveying device during the conveying process.

Figure 3:
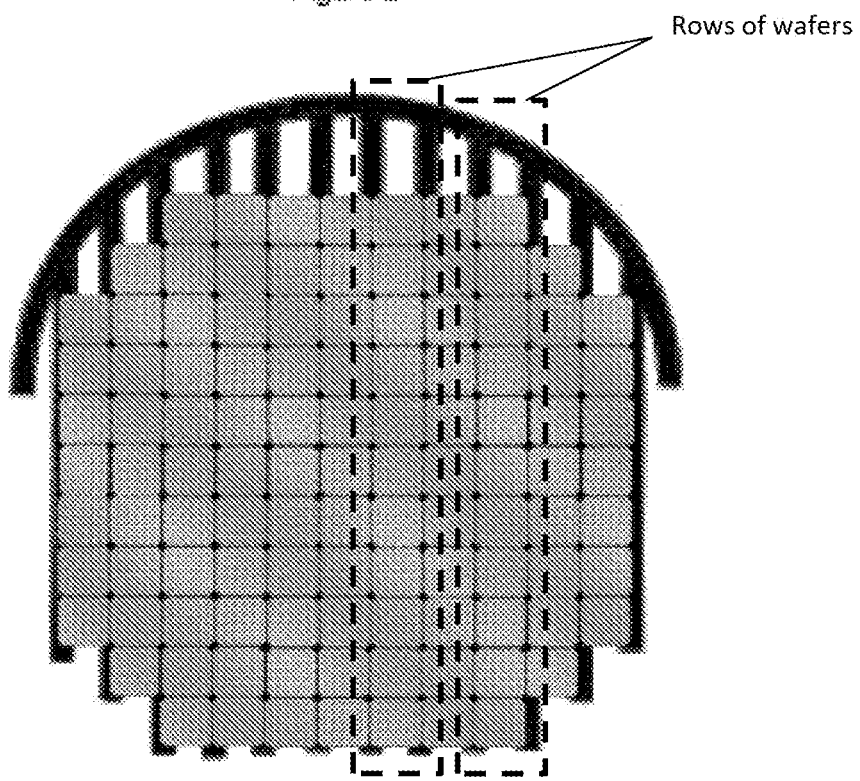
FIG. 3 is a schematic diagram substrates supported by a substrate conveying fork according to an embodiment.

As an example, an array of wafers is placed onto a substrate conveying fork as shown in FIG. 3. Each square shape represents a piece of wafer.

It should be noted that, in the embodiment of the present disclosure, the substrate conveying mechanical arm on the substrate conveying device can extend, retract, and move up and down, so that the substrate conveying device can be conveniently conveyed to a target position. In the embodiment of the present disclosure, the substrate conveying device in the first conveying chamber 141 can transfer substrate from the loading chamber 13 to the first process reaction chamber 151, the second process reaction chamber 152, and to the turnover chamber 16.

The substrate conveying device in the second conveying chamber 142 can convey the substrate from the turnover chamber 16 to the third process reaction chamber 153, the fourth process reaction chamber 154 and to the unloading chamber 17.

Furthermore, in order to facilitate the removal of wafer from the grooves, the side wall of the groove is a slope where the bottom is narrower than the top, so that when the wafer is being picked up from the conveying fork, the wafer can have more clearance in the process of leaving the conveying fork and therefore less likely to be caught on the vertical wall which might break the wafer. In the placement of the wafer, the slope can guide the wafer to the bottom which can be more confined than at the top of the slope and restrict the free movement of the wafer during the conveying process and allows for more accurate placement of the wafer onto the substrate bearing column.

It should be noted that in the embodiment, since the wafer is quadrilateral, and the corner of the wafer is generally a round shape, the structure of the wafer bearing pocket formed by the opposing grooves in two adjacent branches 22 of the conveying fork 21 can be regarded as a flat line with 2 curvatures at the end. Since the wafer cannot rotate or slide forward and backward in such a shape, the edge area of the wafer is constrained.

In addition, in order to improve the throughput of the substrate processing system, two sets of substrate conveying devices can be arranged in the first conveying chamber 141 and the second conveying chamber 142. The two sets of substrate conveying devices are arranged in the first conveying chamber 141, wherein one set of substrate conveying device is used for taking unprocessed substrates from the loading chamber 13 and perform a wafer exchange with the first or second process reaction chambers 151 and 152 respectively. The exchange process comprises the picking up of completed treatment wafers from process reaction chamber and placing a new batch of unprocessed wafers into the process reaction chamber, thereby reducing the time that the chamber isolation valve is open and allows the process chamber to be more efficiently utilized for substrate treatment. Substrate being processed from the first process reaction chamber 151 can be conveyed to the second process reaction chamber 152 in sequential processing mode or directly to the turnover chamber 16 if in parallel processing mode where the first and second process reaction chambers are performing the same treatment to the substrate.

Furthermore, when two sets of substrate conveying devices are arranged in the first conveying chamber 141, the opening time of the isolating valve of the turnover chamber 16 can also be shortened as the substrate conveying device can hold the substrates on the conveying fork for turnover chamber 16 until it is ready to receive the substrates.

Based on the same principle, when two sets of substrate conveying devices are arranged in the second conveying chamber 142, and any one of the third process reaction chamber 153, the fourth process reaction chamber 154 and the turnover chamber 16 is available, the substrate can be directly conveyed to the target chamber without having to wait for two chambers to be ready in order to take from one chamber to the next (such as from chamber 16 to 153 or 154 or from 153 and 154 to unloading chamber 17). Therefore the non-reaction treatment time in the third process reaction chamber 153 and the fourth process reaction chamber 154 can be minimized and improve the overall efficiency of the entire system.

In addition, in order to increase the throughput of the substrate processing system, the opening time of the isolation valve of the loading chamber 13 can be reduced if the substrate loading device arranged at the front end of the loading chamber 13 can have two sets of conveying forks where one fork will be waiting for isolation valve at loading chamber 13 to open while the second conveying fork can be loading substrates by an atmospheric robot 11.

In similar fashion, the unloading chamber 17 can have two sets of conveying forks waiting on the outside as part of the conveying device 18 such that while one sets of substrates are being unloaded by atmospheric robot 19 back into metal cassettes for the wafers, another conveying fork can be positioned outside of unloading chamber 17 to pick up the next batch of completed wafers.

It should be noted that in this disclosure, the substrate conveying device 12 and 18 in front of loading chamber 13 and 17 can be linear travel type but at the same time having similar substrate holding features as the conveying device inside conveying chambers 141 and 142.

In order to unload the substrate from the substrate conveying fork, a plurality of substrate bearing columns are arranged in a pedestal of the first process reaction chamber 151 to the fourth process reaction chamber 154 of the substrate processing system. The substrate bearing columns corresponds to the number and the location of substrates on the conveying fork. The surface of the substrate bearing column are smaller than the size of the substrate. Each substrate bearing column is placed on the pedestal of the process reaction chamber and will support the substrate in between the branches of the conveying fork the substrate, in particular, the substrate bearing columns can be arranged on the base in a row mode, and each row of bearing column can comprise a plurality of bearing columns.

Inside the process reaction chambers 151 to 154, there exist a plurality of substrate bearing columns which can move vertically in an up and down movement and such movement can bring forth the up and down movement of the substrate bearing on such columns with respect to the pedestal in the process reaction chambers. As a specific example, the substrate bearing columns can penetrate both the upper and lower surfaces of the pedestal.

As a specific embodiment, a substrate conveying fork positioning part can be arranged in the first process reaction chamber 151 and in the second, third and fourth process reaction chamber 152, 153 and 154. The conveying fork positioning part is used for positioning the free ends of the branches 22, so that the wafers on the conveying fork and the corresponding substrate bearing columns on the pedestal of the process reaction chambers are aligned vertically in the correct locations.

In addition, a pedestal disposed in the first process reaction chamber 151 to the fourth process reaction chamber 154 is also provided with heating capability so that the substrate placed on the pedestal can be heated to the target reaction temperature.

In the embodiment, the substrate is directly placed on the pedestal without a substrate supporting plate. As the mass of the substrate is small relative to the mass of the pedestal, the heating of the substrate to the target temperature can be achieved in a relatively short time and efficiently. In a specific embodiment when the processing system is a PECVD reactor, the pedestal will form a lower electrode. When combined with the upper gas distribution plate which acts as an upper electrode, a plasma reaction can be formed using the capacitance between the two electrodes. The source of such capacitance is typically generated using RF generators or in some cases by DC generators.

In addition, compared with a substrate processing system in the prior art where a substrate bearing plate is used to support the substrate and such support plate is arranged between the upper electrode and the lower electrode in a plasma environment, there is uncertainty if the support plate is grounded or floating in the plasma potential, thereby causing uncertainty in the electrical field inside the plasma environment. According to the substrate processing system provided by the embodiment, when the substrate to be treated can be directly placed between the upper electrode and the lower electrode of the plasma reaction system such that the contact between the substrate and the pedestal can be established more uniformity with less gap than a large plate with uncertain flatness and warpage. Since large and variable gap changes capacitance between the different components within the electrodes of the plasma environment, there will be more uncertainty in the prior art chamber design and therefore more inconsistent performance which ultimately lowers the yield of the final product.

As an alternate embodiment, in order to reduce the process reaction time of the substrate in the first process reaction chamber 151 to the fourth process reaction chamber 154, a wafer bearing column arranged in the loading chamber 13 can be used for heating a substrate placed on the wafer bearing column, so that the temperature of the heated substrate is close to the processing temperature of the substrate. In order to accelerate the cooling treatment of the substrate, a further alternate embodiment is provided such that a cooled substrate bearing column is arranged in the unloading chamber 17 and can be used to cool the substrate prior to exiting the processing system.

It should be noted that in the substrate processing system shown in FIG. 1, according to the pre-determined substrate processing mode, the substrate can be treated in the first process reaction chamber 151 and in the second process reaction chamber 152 by adopting the same treatment process conditions. Alternately, the substrate can be treated by adopting different processing process conditions in each process reaction chambers in the first process reaction chamber 151 and the second process reaction chamber 152. Similarly, the third process reaction chamber 153 and the fourth process reaction chamber 154 can be arranged to treat the substrate with the same conditions or different conditions.

As a specific embodiment of the present disclosure, the substrate loading device and the substrate unloading device 18 can be the same structure as the substrate conveying device described above. Therefore, there is no need for a substrate bearing plate to handle the loading and unloading of substrate.

Figure 4A:
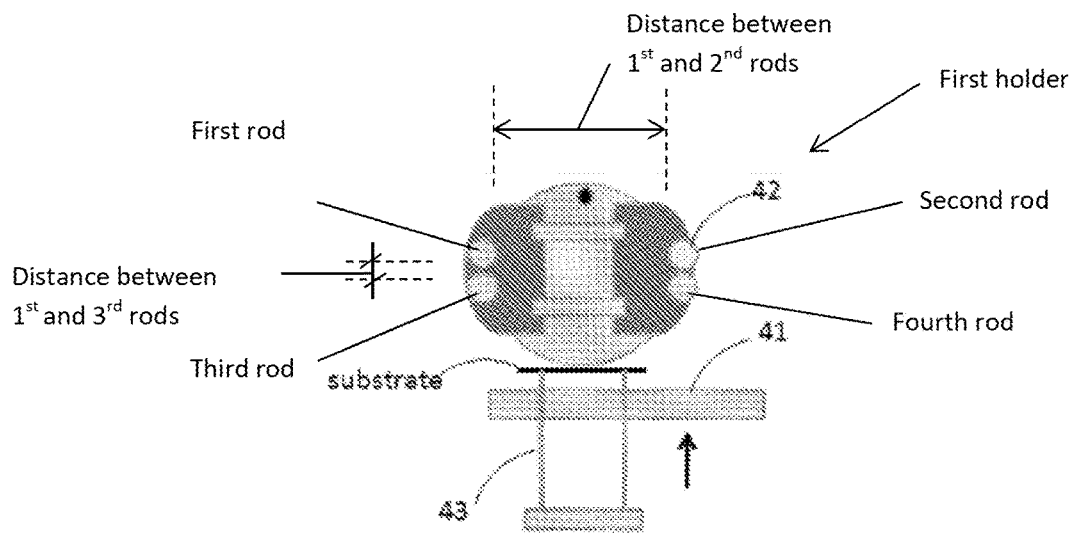
FIG. 4A is a diagram of the wafer turnover device.

The following describes the specific structure of the substrate turnover device arranged in the turnover chamber 16. FIG. 4A is a schematic diagram of a substrate turnover device. As shown in FIG. 4A, the substrate turnover device comprises: the pedestal 41 used for bearing the substrate, and the edge clamping device 42 used for clamping the edge of the wafer. A plurality of substrate bearing columns 43 are arranged on the pedestal 41. The arrangement of the substrate bearing column 43 can be the same as the arrangement of the substrate on the conveying fork. Each substrate bearing column can also have a plurality of lifting columns. The substrate bearing column can lift the substrates off the pedestal by abutting against the center area of the substrate, so that the edge region of the lower surface of the substrate is exposed and enable the edge clamping device 42 to be used to clamp the substrate.

According to the embodiment, the substrate bearing column 43 can penetrate through the upper and lower surfaces of the pedestal 41 and can move vertically in the up and down directions and carrying a substrate off the pedestal in the same directions.

In order to reduce the processing time of the substrate in the process reaction chamber, the pedestal arranged in the turnover chamber can be used for heating the substrate so that the temperature of the substrate is close to the processing temperature of the target process reaction chamber.

It should be noted that, as another embodiment of the present disclosure, a pedestal is not arranged in the turnover chamber 16, such that the substrate conveyed from the first conveying chamber 142 is placed on the substrate bearing column. After completion of the turnover of the substrate, the substrate remains on the substrate bearing column.

Figure 5:
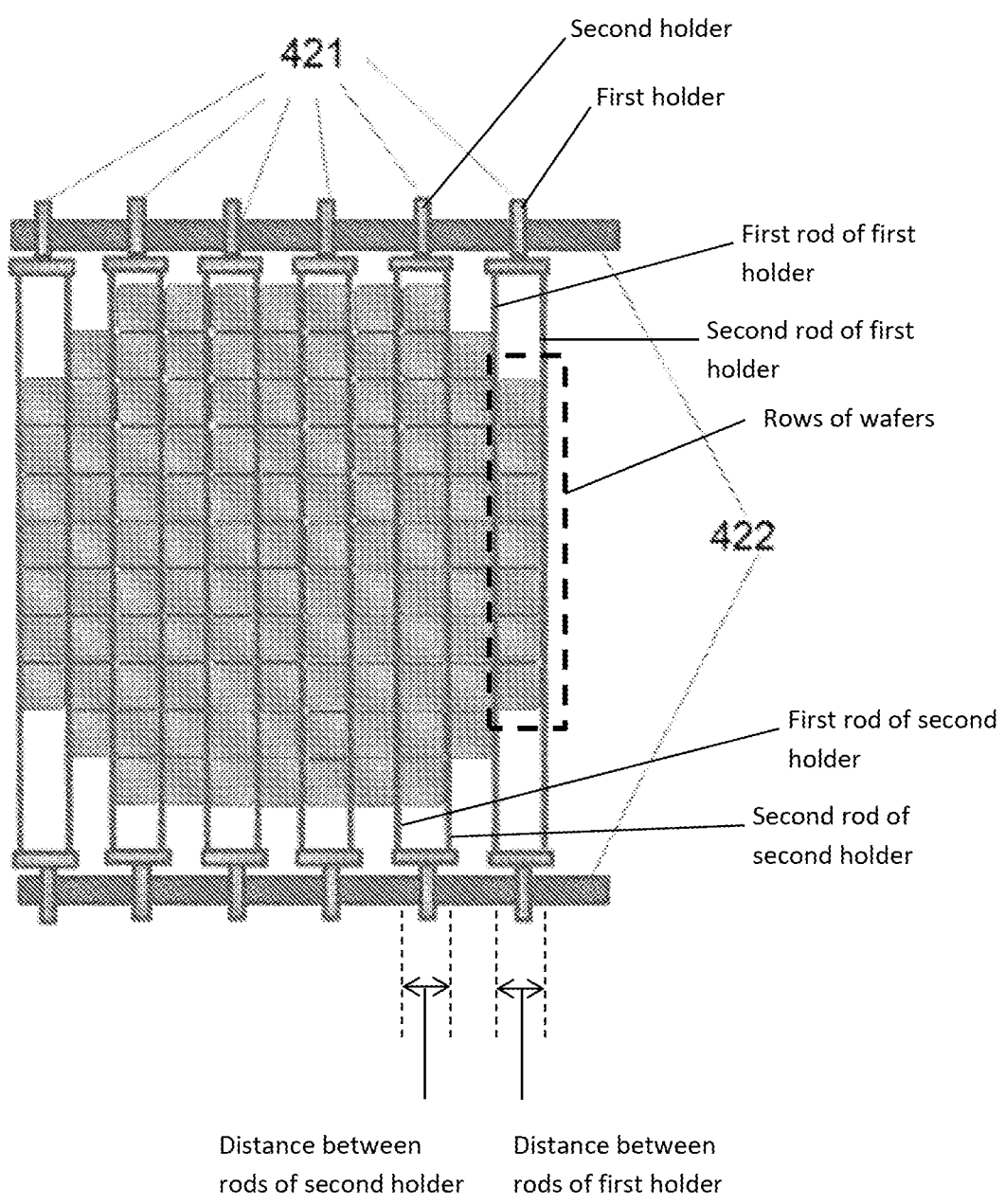
FIG. 5 is the layout of wafer turnover device which is made up of clamping rods above and below the wafers.

The following illustrates the schematics of the edge clamping device 42:

FIG. 5 shows a schematic diagram of an edge clamping system 42. As shown in FIG. 5, the edge clamping system 42 includes a plurality of mutually parallel clamping unit 421 and a bracket 422 connected with the two ends of each clamping unit 421. Each clamping unit 421 is used for clamping a row of wafers, and each clamping unit 421 comprises a plurality of clamping rods which are oppositely arranged in up and down directions for both opposite edges of the same wafer. The upper and lower oppositely-arranged clamping rods are used for clamping the edge regions of the upper and lower surfaces of a row of wafers. The clamping rods which are oppositely arranged in the vertical direction can move in the vertical direction, or the clamping rods which are oppositely arranged in the vertical direction and the horizontal direction can move in the vertical direction and in the horizontal direction, so that the wafer can be clamped and loosened in the wafer turnover process.

It should be noted that, as an embodiment of the present disclosure, the substrate in the turn-over process may need certain space to perform the rotation. Therefore adjacent substrates which are close to each other are not feasible to be turned over in the same instance. Therefore the embodiment states that in any single turning over event, rows of substrate non adjacent to each other can be turned over simultaneously. FIG. 5 illustrates two adjacent clamping unit 421 having the width of one wafer distance in between the clamping rods. Bracket 422 can be shifted to the next position to allow for the turning over of wafers not previously turned. Typically all the wafers can be turned in 2 cycles in this turnover system 42.

As a specific embodiment, in order to enable the substrate to be accurately conveyed to the positions of the substrate bearing column of the turnover chamber, the turnover chamber can further comprise a substrate conveying fork positioning component. The conveying fork positioning component is used for positioning the free ends of the branches, so that the conveyed substrate and the substrate bearing column can correspond to each other accurately in the vertical direction.

In addition, due to the fact that the up-down movement of the substrate is driven by the up-and-down movement of the substrate bearing column below the substrate, in order to control the substrate to move up and down at the same time or moving alternate rows of substrate up and down and/or moving non adjacent rows of substrate up and down in a synchronized manner, there must be a lift control device which can select the rows of substrate columns to be lifted in such an event.

As an alternative embodiment, in order to achieve preheating of the substrate, the substrate processing system further comprises a preheating chamber (not shown) which is arranged at the front end of the loading chamber 13 and is communicated with the loading chamber 13. An isolation valve is arranged between the preheating chamber and the loading chamber 13; a pedestal used for bearing the substrate is arranged in the preheating chamber, wherein a plurality of substrate bearing columns are arranged on the pedestal, the plurality of substrate support columns corresponds to a plurality of wafers to be borne, and the surface of the substrate bearing column is smaller than the surface of the wafer, wherein each substrate bearing column can be used for lifting a wafer placed on the bearing column from the pedestal.

In order to achieve cooling of the treated substrate, the substrate processing system can further comprise a cooling chamber (not shown) which is arranged at the rear end of the unloading chamber and is communicated with the unloading chamber. An isolating valve is arranged between the cooling chamber and the unloading chamber 17.

The cooling chamber described above has a pedestal and a plurality of substrate bearing column arranged on the pedestal corresponding the plurality of wafers conveyed from the unloading station. The surface of the substrate bearing column is smaller than the surface of the wafer and can be used for lifting a wafer placed on the pedestal from the unloading chamber.

The embodiments provided above are the specific implementation modes of the substrate processing system.

It should be noted that in the embodiments, each chamber in the substrate processing system can be arranged in circular manner to form a cluster and can also be arranged in a linear manner to form a linear cluster. The basic processing system adopting the circular cluster system structure may occupy less area of footprint while a linear cluster system may be more effective in a building where pillars may be more restricting to a circular cluster.

As an example, the substrate processing system can be a PECVD (Plasma-Enhancement Chemical Vapor Deposition) system.

When the substrate processing system is a PECVD processing system, two electrodes which are opposite to each other are arranged in the first process reaction chamber 151 to the fourth process reaction chamber 154. The two electrodes which are opposite to each other are the heated pedestal (lower electrode) and gas distributing upper electrode. The pedestal can heat the substrates to the required deposition temperature while the gas distribution plate provides the chemicals to be ionized into radicals in the presence of an electrical field or plasma. For solar energy application, the film deposition temperature is generally between 180 DEG Celcius and 250 DEG Celcius. In the process reaction chambers 151 to 154, Radio Frequency generators applied a voltage across the two electrodes to form a plasma. One or more layers of films can be deposited onto the surface of the substrate in the process reaction chambers 151 o 154. The thin film may be deposited in tandem in the same chamber or one layer after another in different process reaction chambers.

The substrate processing system provided by the embodiment can be applied to the surface treatment process of heterojunction photovoltaic cell fabrication.

When the substrate processing system is applied to the deposition of the heterojunction cell structure as an example, the first process reaction chamber 151 to the fourth process reaction chamber 154 can be respectively used for generating intrinsic and doped layers of Silicon for the photovoltaic device. For example, a p-type doped Silicon (Boron-doped) and n-type doped Silicon (phosphorus-doped) and i-type intrinsic Silicon.

It should be noted that the substrate processing system shown in FIG. 1 comprises of two conveying chambers and four process reaction chambers, the number of conveying chambers and the number of process reaction chambers are only an example, and is not to be construed as a limitation of the substrate processing system provided by the present disclosure. In fact, the substrate processing system can comprise of one conveying chamber and one process reaction chamber and can also comprise of other types of conveying chambers and process reaction chambers in practical applications. The number of the conveying chambers and the number of the process reaction chambers in the substrate processing system can be set according to actual needs. In this way, any examples of the conveying chamber and process reaction chamber combinations utilizing this substrate conveying method are included in the scope of this disclosure.

The process flow of the substrate processing system described in the above embodiment is as follows:

The substrate loading robot 11 conveys the substrate to the substrate conveying fork 12 by conveying the substrate to a location above wafer bearing columns of the loading chamber 13 where the substrate is aligned with each of the corresponding wafer bearing column below. Then the substrate is lowered onto the substrate bearing columns in the loading chamber 12. After that, the substrate conveying robot moved out of the loading chamber and the isolation valve at the front end of the loading chamber 13 is closed. The loading chamber can be pumped down to a reduce pressure.

Next, the substrate conveying device in the first conveying chamber 141 picks up the substrate from the loading chamber 13 and conveys to the first process reaction chamber 151 and to the second process reaction chamber 152 to processing the first surface of the substrate. After processing is completed in the first process reaction chamber 151 and the second process reaction chamber 152, the substrate is conveyed to the turnover chamber 16 by the substrate conveying device in the first conveying chamber 141. The substrate turnover device in the turnover chamber 16 is used for turning over the substrate, so that the surface which has been processed previously faces downwards, and the surface which is not processed now faces upwards. Afterwards, the substrate is conveyed into the third process reaction chamber 153 and the fourth process reaction chamber 154 by the substrate conveying device in the second conveying chamber 142. The second surface of the substrate is then processed, and completed the treatment of both surfaces of the substrate. Finally the substrate is conveyed to the unloading chamber 17 where the substrate will be picked up by the substrate conveying device outside of the unloading station and back into the metal cassettes for the substrate. Therefore the substrate conveying system comprising the turnover chamber can complete the treatment of both surfaces of the substrate in a processing system without having to send the substrate out to be turned over in between the treatment of the two surfaces. The turn over chamber also acts as a buffer chamber to eliminate cross contamination and is therefore an effective system to improve on the yield.

Based on the substrate turnover device provided by the embodiment, a specific implementation mode of the substrate turnover method may be achieved.

It should be noted that in the embodiments of the present disclosure that only one row of the multiple rows of substrate which are not adjacent to each other can be turned over in any one-step turnover process. Therefore, through this specific implementation mode, the turnover of all substrates can only be completed by a plurality of times of exercising this turnover process.

Figure 6:
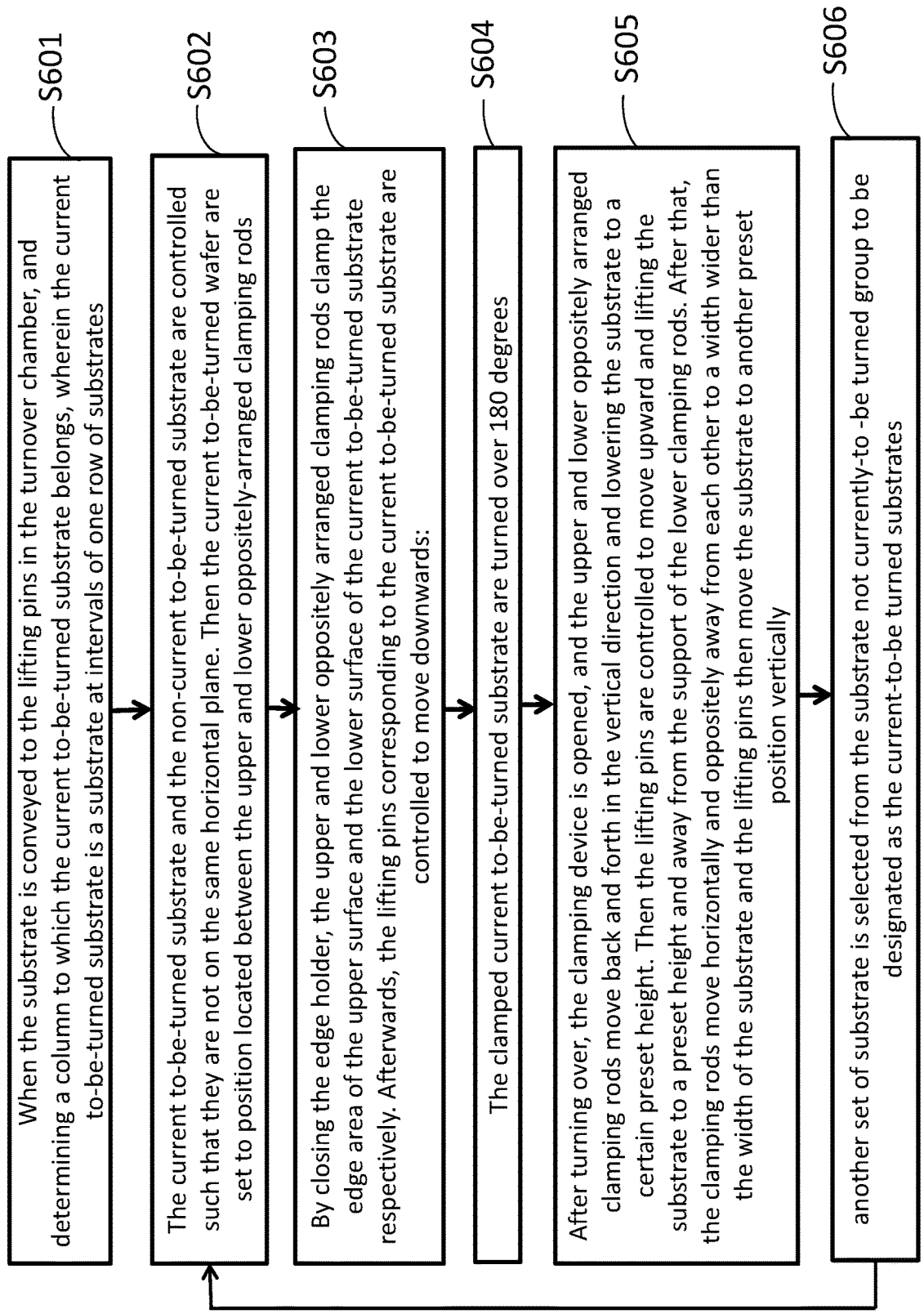
FIG. 6 is a flow diagram of a first embodiment of a substrate turnover method according to an embodiment.

FIG. 6 is a flow chart of a first embodiment of a substrate turnover method according to an embodiment of the present disclosure. As shown in FIG. 6, the substrate turnover method comprises the following steps:

S601: When the substrate is conveyed to the lifting columns in the turnover chamber, and determining a column to which the current to-be-turned substrate belongs, wherein the current to-be-turned substrate is a substrate at intervals of one row of substrates.

This step comprises the receiving of substrate conveyed by the substrate conveying device in the first conveying chamber 141. The lifting columns arranged in the turnover chamber 16 are moved to a certain height in advance (the height can be referred to as the conveying height of the substrate)) so as to facilitate the reception of the substrate conveyed by the substrate conveying device. After the substrate is conveyed to the lifting columns of the turnover chamber 16, the substrate conveying device is moved out of the turnover chamber 16, and the isolation valve between the turnover chamber 16 and the first conveying chamber 141 is closed, so that the reduced pressure environment is kept in the turnover chamber.

Substrate designated as the substrate to be turned over is turned with substrates in every other row of substrate.

S602: The current to-be-turned substrate and the non-current to-be-turned substrate are controlled such that they are not on the same horizontal plane. Then the current to-be-turned wafer are set to position located between the upper and lower oppositely-arranged clamping rods.

It should be noted that the lifting columns arranged in the turnover chamber can move up and down in the vertical direction. In order to provide enough space for the current substrate to be turned over, the current to-be-turned substrate and the non-current to-be-turned substrate cannot to be at the same height. Therefore the lifting columns of the current to-be-turned substrate and/or the lifting columns corresponding to the non-current to-be-turned substrate can be controlled to move up and down in the vertical direction, so that the two substrates are not located on the same horizontal plane, and enabling the current to-be-turned substrate to be positioned between the upper and lower oppositely-arranged clamping rods of the turnover device.

In general, the turning height (the height at which the substrate is turned over) is higher than the conveying height, so, as an example, the lifting columns corresponding to the current to-be-turned substrate are controlled to move upwards in the vertical direction, and the lifting columns corresponding to the non-current to-be-turned substrate are moved either up or down in the vertical direction, so that the two substrates are not located on the same horizontal plane. Alternately, the lifting columns corresponding to the current to-be-turned substrate can be controlled to move upwards while the lifting columns corresponding to the non-current to-be-turned substrate can be controlled to move downwards so that the current to-be-turned substrate and the non-current to-be-turned substrate are not on the same horizontal plane and enabling the current to-be-turned substrate to be positioned between the upper and lower oppositely-arranged clamping rods.

S603: By closing the edge holder, the upper and lower oppositely arranged clamping rods clamp the edge area of the upper surface and the lower surface of the current to-be-turned substrate respectively. Afterwards, the lifting columns corresponding to the current to-be-turned substrate are controlled to move downwards:

It should be noted that when the edge clamping device is closed and the upper and lower oppositely-arranged clamping rods respectively clamp the edge area of the upper surface and the lower surface of the substrate to be turned over, the current to-be-turned substrate is borne by the clamping rod on the edge clamping device and can be separated from the lifting column.

Therefore, in order to provide the turnover space below the current to-be-turned substrate, the lifting columns corresponding to the current to-be-turned substrate must be controlled to move downwards.

S604: The clamped current to-be-turned substrate are turned over 180 degrees

S605: After turning over, the clamping device is opened, and the upper and lower oppositely arranged clamping rods move back and forth in the vertical direction and lowering the substrate to a certain preset height. Then the lifting columns are controlled to move upward and lifting the substrate to a preset height and away from the support of the lower clamping rods. After that, the clamping rods move horizontally and oppositely away from each other to a width wider than the width of the substrate and the lifting columns then move the substrate to another preset position vertically.

It should be noted that, in the embodiment of the present disclosure, the movement of the lifting column can drive the substrate placed on the lifting columns to move in an up and down movement. In particular, the turned substrate can be controlled to move to any preset positions.

It should be noted that after the substrate is turned over, the substrate conveying device may convey the substrate to the second conveying chamber 142, and then further to a third process reaction chamber and/or a fourth process reaction chamber for treatment of the second surface of the substrate. Therefore the preset position for the substrate to rest on the lifting columns is the preset height for the substrate conveying device to conveniently grab the substrate. This can also be considered as the substrate conveying position.

As another embodiment, when a pedestal is used in the turnover chamber for bearing the substrate, the pedestal can be arranged to have a heating function where substrates which have been turned over can be heated to process temperature to prevent cooling off of the substrate and to preheat the substrate to process temperature for the successive process treatment in process reaction chambers 153 and 154.

S606: Another set of substrate is selected from the substrate not currently-to-be turned group to be designated as the current-to-be turned substrates.

S607: Repeat the steps S602 to S606 until all the substrates are turned over in the turnover chamber 16.

Figure 4B:
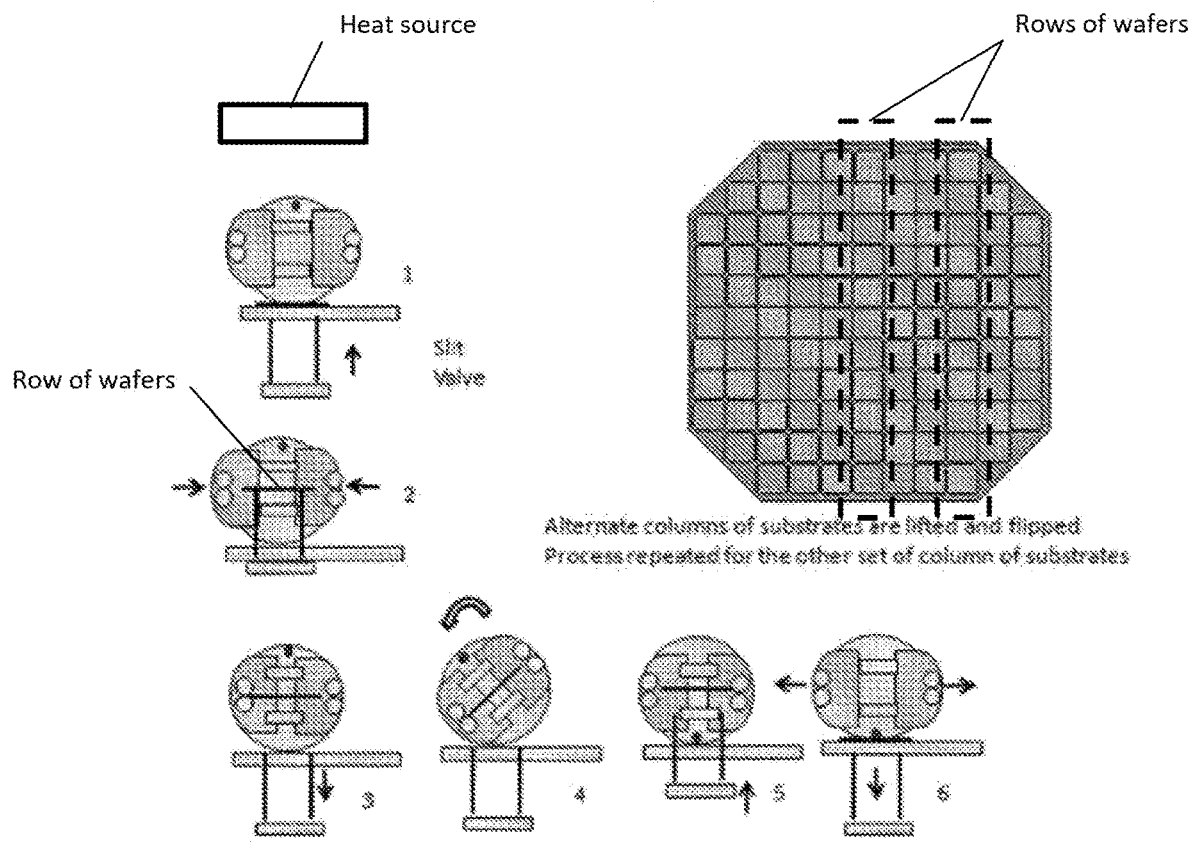
FIG. 4B illustrates an operation of the wafer turnover device.

The above features regarding the turning over of the substrate are graphically illustrated in FIG. 4B.

It should be noted that in the embodiments of the present disclosure, the substrate may need a certain space around it in order to turnover. Therefore, substrates on two adjacent rows may not be turned over at the same time. According to the embodiment, the substrate corresponding to every other row of substrates is turned over for the first time at the same time, and the rest substrates are turned over for the second time at the same time, so that all the substrates can be turned over.

According to the specific implementation mode of the substrate turnover method, turning over all the substrate is realized through two sequences of turnover of substrates. Therefore, the efficiency of the specific implementation mode is very high.

It should be noted that the method of turning over substrate can be an extended embodiment of the present disclosure. In one sequence of substrate turn over process, the substrate on the adjacent columns cannot be turned. However, the turning process is not limited to turning over alternate rows of substrates; it can also be done to rows more than 1 substrate width apart. The turning sequence can be done more than twice in order to finish the turning over of all the substrates.

It should be noted that in the embodiments of the present disclosure, the substrate conveying devices in the first conveying chamber 141 and the second conveying chamber 142 can convey substrates from either side of the turnover chamber.

Figure 7:
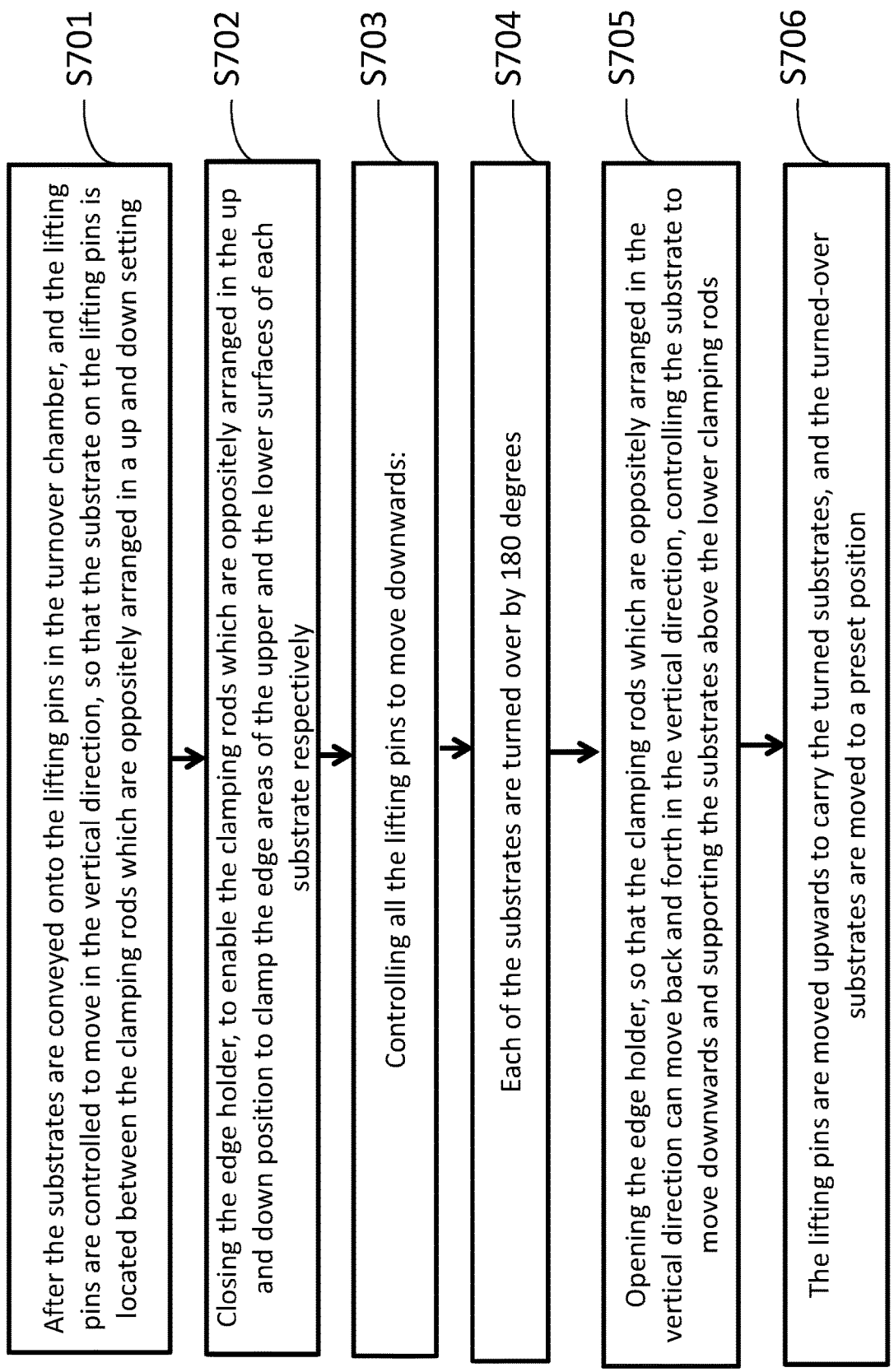
FIG. 7 is a flow diagram of the second embodiment of a substrate turnover method according to an embodiment.

In addition, the disclosure further provides a second specific implementation mode of the substrate turnover method. FIG. 7 is a flow chart of a second specific embodiment of a substrate turnover method provided by an embodiment of the present disclosure. As shown in FIG. 7, the specific implementation method comprises the following steps:

S701: After the substrates are conveyed onto the lifting columns in the turnover chamber, and the lifting columns are controlled to move in the vertical direction, so that the substrate on the lifting columns is located between the clamping rods which are oppositely arranged in a up and down setting.

This step specifically comprises the receiving of the substrate conveyed by the substrate conveying device in the first conveying chamber 141. The lifting columns arranged in the turnover chamber 16 are moved to a certain height in advance (the height can be referred to as the conveying height of the substrate) so as to facilitate the reception of a position of the substrate conveyed by the substrate conveying device (which can be referred to as a substrate transfer position). After the substrate is conveyed onto the lifting columns of the turnover chamber 16, the substrate conveying device is moved out of the turnover chamber 16, and the isolation valve between the turnover chamber 16 and the first conveying chamber 141 is closed, so that the vacuum environment is kept in the turnover chamber.

S702: Closing the edge holder, to enable the clamping rods which are oppositely arranged in the up and down position to clamp the edge areas of the upper and the lower surfaces of each substrate respectively;

S703: Controlling all the lifting columns to move downwards.

It should be noted that when the substrate is clamped by the clamping rods which are oppositely arranged in the up and down positions, the substrate can be separated from the support of the lifting columns. In order to create space for turning over the substrates, the lifting columns are controlled to move downwards.

S704: Each of the substrates are turned over by 180 degrees.

S705: Opening the edge holder, so that the clamping rods which are oppositely arranged in the vertical direction can move back and forth in the vertical direction, controlling the substrate to move downwards and supporting the substrates above the lower clamping rods.

S706: The lifting columns are moved upwards to carry the turned substrates, and the turned-over substrates are moved to a preset position.

It should be noted that after the substrate is turned over, the substrate are conveyed by the conveying device from the second conveying chamber 142 and conveyed to a third process reaction chamber and/or to a fourth process reaction chamber for further processing. The preset position for the substrates on lifting columns described earlier as a substrate conveying position can be used for the second conveying device to conveniently grab the substrates from the turnover chamber 16.

As an alternative embodiment, when a pedestal used for bearing the substrate is arranged in the turnover chamber, and the turned wafer can be transferred to the pedestal, when the pedestal is capable of heating the substrate placed on the pedestal, the pedestal can be used for heating the turned over substrates.

The substrate turnover method provided by the above embodiment is a second specific implementation mode of the substrate turnover method. Through this specific implementation mode, all the substrates can be turned over at one time, and when the substrate is turned over through the specific implementation mode, the substrate conveying device of the first conveying chamber 141 and the second conveying chamber 142 can only convey and grab the substrate through two opposite openings of the turnover chamber.

The two specific embodiments of the substrate turnover methods are provided by the embodiment. Through these two specific embodiments, the turnover of the substrate can be realized in a vacuum environment.

It should be noted that for the entire process of the substrate in the substrate processing system, after one surface is processed, the substrate needs to be turned over before the other surface is processed. Therefore, after one surface treatment is carried out, the substrate needs to be conveyed into the turnover chamber from the process reaction chamber. As a specific embodiment, before the step s601 or the step s701, the substrate turnover method can further comprise the following steps:

The substrate is conveyed to the turnover chamber by the substrate conveying device in the first conveying chamber 141.

A specific implementation method of conveying the substrate to the turnover chamber through the substrate conveying device in the first conveying chamber is described below in conjunction with FIG. 8.

Figure 8:
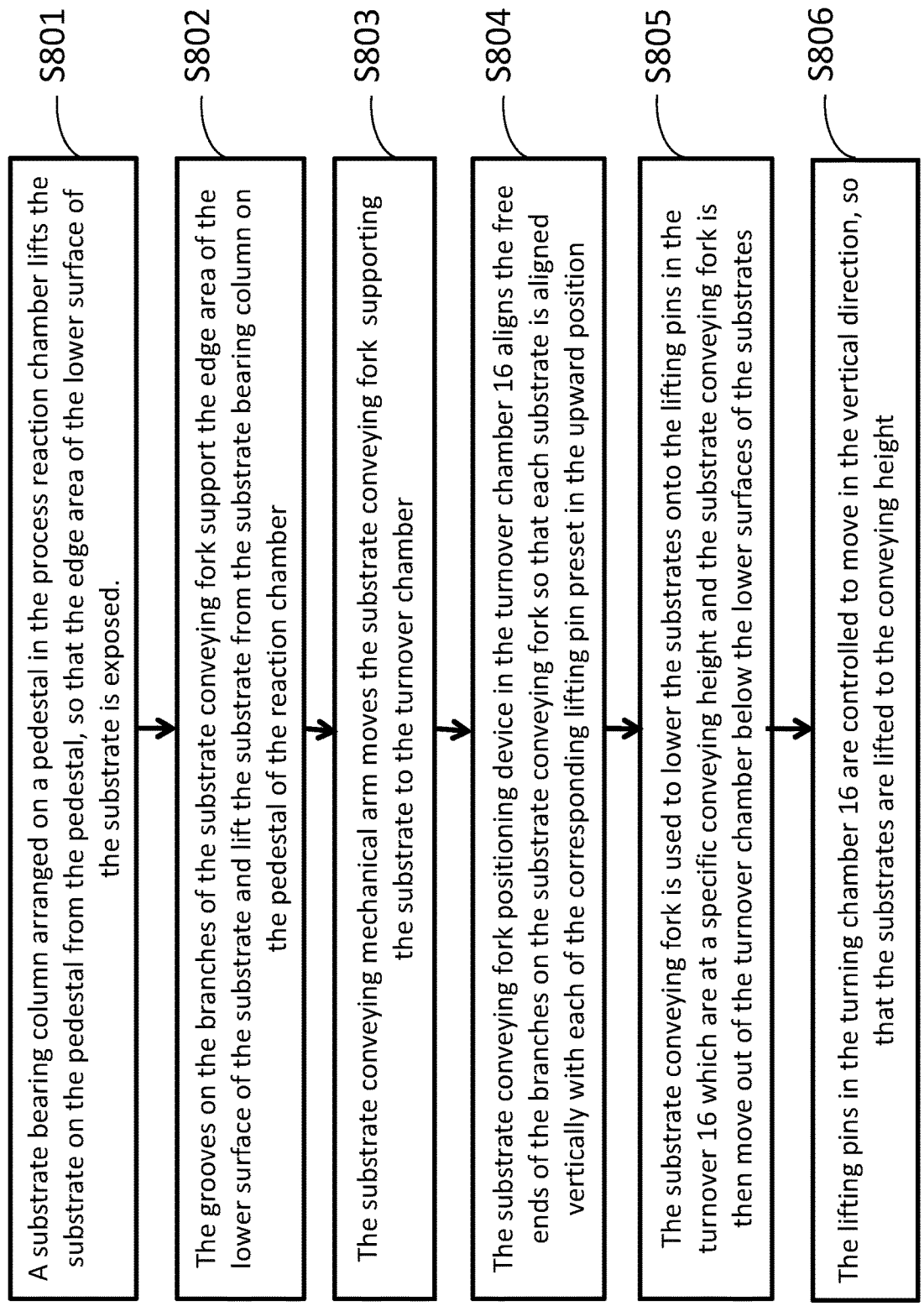
FIG. 8 is a schematic flow chart of a substrate conveying method according to an embodiment.

FIG. 8 is a flow diagram of a method for conveying a substrate from a process reaction chamber to a turnover chamber through a substrate conveying device in a first conveying chamber 141. As shown in FIG. 8, the method comprises the following steps:

S801: A substrate bearing column arranged on a pedestal in the process reaction chamber lifts the substrate on the pedestal from the pedestal, so that the edge area of the lower surface of the substrate is exposed.

S802: The grooves on the branches of the substrate conveying fork support the edge area of the lower surface of the substrate and lift the substrate from the substrate bearing column on the pedestal of the reaction chamber.

S803: The substrate conveying mechanical arm moves the substrate conveying fork supporting the substrate to the turnover chamber.

S804: The substrate conveying fork positioning device in the turnover chamber 16 aligns the free ends of the branches on the substrate conveying fork so that each substrate is aligned vertically with each of the corresponding lifting column preset in the upward position.

S805. The substrate conveying fork is used to lower the substrates onto the lifting columns in the turnover 16 which are at a specific conveying height and the substrate conveying fork is then move out of the turnover chamber below the lower surfaces of the substrates.

It should be noted that, in order to place the substrates onto the lifting columns from the substrate conveying fork so that the substrate conveying fork can be conveniently pulled away from the lower surface of the substrate, the lifting columns corresponding to the substrates are lifted in advance before the substrates are placed onto the lifting columns.

S806: The lifting columns in the turning chamber 16 are controlled to move in the vertical direction, so that the substrates are lifted to the conveying height.

It should be noted that when the pedestal is arranged in the turnover chamber 16, the substrate can also be conveyed to the pedestal.

The above is a specific implementation mode of the substrate conveying method provided by the embodiment.

As shown in the embodiment above, the substrate conveying device has grooves on each of the substrate conveying fork and each two opposing grooves in adjacent branches form a substrate supporting structure for supporting a substrate. A plurality of substrate supporting structures formed by the grooves in every two adjacent branches can support a row of substrates. In the conveying process of the substrate, the substrate is placed in the grooves and can be secured on the substrate conveying fork during the conveying process. In addition, when using the substrate conveying device, and substrate bearing columns arranged on a pedestal in the process reaction chamber and various chambers in the substrate conveying system, the substrate can be conveyed from the loading chamber to the process reaction chamber without the use of a substrate bearing plate.

In addition, the substrate conveying device is based on the substrate conveying device, a conveying method, a pedestal arranged in the process reaction chamber and substrate bearing columns arranged on the pedestal, the substrate can be directly placed on the pedestal of the process reaction chamber and can be heated to the processing temperature without having to heat up a substrate support plate in between. Since the mass of the substrate is small, the substrate can be heated to processing temperature in a short time, so that the processing time and energy spent are reduced.

In addition, due to the fact that the substrate can be directly placed on the pedestal and therefore no need for the substrate bearing plate, the need to clean such a plate periodically is eliminated and significantly reduces the cost of operation. In addition, for the substrate needing to be processed on the front surface and the back surface can be better off without the use of a substrate bearing plate which can lead to cross contamination from the front and back processes. Therefore, the substrate conveying device and the conveying methods can reduce the cross contamination of the substrate and improve the yield of the substrate.

In addition, after the substrate is processed and conveyed to the unloading chamber, the substrate can be directly cooled. Due to the fact that the mass of the substrate is small the cooling of the substrate can be very fast and therefore accelerate the completion of the substrate processing steps.

In conclusion, by utilizing the substrate conveying device and the substrate processing method described herein, a substrate bearing plate will not be needed to process the substrates. The defects associated with the substrate bearing plate in the prior art can be eliminated. The substrate processing steps can also be simplified and the processing efficiency is improved.

The above descriptions are only preferred embodiments and are not intended to limit the claimed invention in any form. Although the present disclosure has been described by way of examples and in terms of preferred embodiments, it is to be understood that the claimed invention is not limited thereto. Any person skilled in the art can make many possible changes and modifications to the technical scheme of the disclosure, or modify to the equivalent embodiment without departing from the technical scheme of the claimed invention. Any simple modification made to the above embodiments or equivalent changes and modifications are all within the protection scope of the technical scheme of the claimed invention.

LABELLING

11. Atmospheric loading robot
12: Substrate loading device
13: Loading chamber
141: First substrate conveying chamber
142: Second substrate conveying chamber
151: First Process reaction chamber
152 Second Process reaction chamber
153: Third process reaction chamber
154: Fourth process reaction chamber
16: Substrate turnover chamber
17: Unloading chamber
18: Substrate unloading device
19: Atmospheric unloading robot
110: Isolation valve
21: Main body of fork
22: Branches of the fork
41: Pedestal
42: Edge gripper
43: Lifting columns
421: Clamping device
422: Structural members to connect the two ends of the turnover device

The invention claimed is:

1. A device for manipulating a plurality of rows of wafers, comprising:
    a plurality of columns configured to support respective ones of the wafers, wherein a supporting surface of one of the columns is smaller than a surface of one of the wafers; and
    a first holder configured to hold one of the rows of wafers, the first holder having a first rod and a second rod, the first rod and the second rod facing each other directly and defining a space therebetween for accommodating the one of the rows of wafers;
    wherein a distance between the first rod and the second rod facing each other directly is variable; and
    wherein the first holder is longer than the wafers in the one of the rows of wafers, thereby providing the first holder with an ability to simultaneously hold the wafers in the one of the rows of wafers.

2. The device according to claim 1, wherein each of the first rod and the second rod is configured to move in a direction that is parallel to a plane of the wafers in the one of the rows of wafers.

3. The device according to claim 1, wherein the first holder further comprises a third rod and a fourth rod, the third rod and the fourth rod defining a space therebetween for accommodating the one of the rows of wafers.

4. The device according to claim 3, wherein a distance between the first rod and the third rod is variable.

5. The device according to claim 1, wherein the first holder is configured to rotate the one of the rows of wafers to turn over the one of the rows of wafers.

6. The device according to claim 1, further comprising a second holder configured to hold another one of the rows of wafers, the second holder having a first rod and a second rod, the first rod and the second rod of the second holder defining a space therebetween for accommodating the other one of the rows of wafers; wherein a distance between the first rod and the second rod of the second holder is variable;
    wherein the one of the rows of wafers and the other one of the rows of wafers are non-adjacent rows.

7. The device according to claim 1, wherein the plurality of columns are arranged in rows, and wherein the device further comprises a movement control configured to selectively move all of the columns in all of the rows of columns simultaneously, move one row of the columns simultaneously, or move multiple non-adjacent rows of the columns simultaneously.

8. A processing system comprising the device according to claim 1, and a heat source configured to provide heat to the rows of wafers.

9. A processing system comprising:
a vacuum chamber; and
the device according to claim 1, wherein the device is located in the vacuum chamber.

10. The device according to claim 1, wherein the device is a part of a processing system that comprises a vacuum chamber; and
wherein the device is located in the vacuum chamber.

11. The device of claim 1, further comprising one of the wafers.

12. A device for manipulating at least a first row of wafers and a second row of wafers, comprising:
a first holder configured to hold the first row of wafers, the first holder having a first rod and a second rod, the first rod and the second rod of the first holder facing each other directly and defining a space therebetween for accommodating the first row of wafers, wherein a distance between the first rod and the second rod of the first holder facing each other directly is variable; and
a second holder configured to hold the second row of wafers, the second holder having a first rod and a second rod, the first rod and the second rod of the second holder defining a space therebetween for accommodating the second row of wafers, wherein a distance between the first rod and the second rod of the second holder is variable;
wherein the first holder is longer than the wafers in the first row of wafers, thereby providing the first holder with an ability to simultaneously hold the wafers in the first row of wafers.

13. The device according to claim 12, wherein each of the first rod and the second rod of the first holder is configured to move in a direction that is parallel to a plane of the wafers in the first row of wafers.

14. The device according to claim 12, wherein the first holder further comprises a third rod and a fourth rod, wherein a distance between the third rod and the fourth rod is variable, and wherein a distance between the first rod and the third rod is also variable.

15. The device according to claim 12, wherein the first holder is configured to rotate the first row of wafers to turn over the first row of wafers.

16. The device according to claim 12, wherein the first row of wafers and the second row of wafers are non-adjacent rows.

17. A processing system comprising:
the device according to claim 12;
a fork having branches for supporting the first row of wafers and the second row of wafers; and
a positioning device configured to position the fork.

18. A processing system comprising:
the device according to claim 12;
a loading chamber for loading the first and second rows of wafers;
a conveying chamber for conveying the first and second rows of wafers;
one or more process reaction chambers for treating the first and second rows of wafers;
a turnover chamber in which the device is located; and
an unloading chamber for unloading the first and second rows of wafers.

19. A processing system comprising:
the device according to claim 12;
a chamber; and
a fork in the chamber, wherein the fork is configured to support the first row of wafers and the second row of wafers, the fork having a main body and a plurality of parallel branches, one end of each of the branches is connected to the main body, and another end of each of the branches is a free end;
wherein each of the branches has a plurality of grooves; and
wherein the grooves in a first one of the branches and the grooves in a second one of the branches are oppositely arranged with respect to each other to support the first row of wafers or the second row of wafers.

20. The processing system according to claim 19, wherein one of the grooves in one of the branches is a part of a sloped side wall.

21. The processing system according to claim 19, further comprising:
a loading device arranged at a front end of a loading chamber; and
an unloading device arranged at a rear end of an unloading chamber.

22. A processing system comprising:
a vacuum chamber; and
the device according to claim 12, wherein the device is located in the vacuum chamber.

23. The device according to claim 22, wherein the device is a part of a processing system that comprises a vacuum chamber; and
wherein the device is located in the vacuum chamber.

24. The device according to claim 12, wherein the device is a part of a processing system that comprises:
a fork having branches for supporting the first row of wafers and the second row of wafers;
a positioning device configured to position the fork.
a chamber;
a fork in the chamber, wherein the fork is configured to support the first row of wafers and the second row of wafers, the fork having a main body and a plurality of parallel branches, one end of each of the branches is connected to the main body, and another end of each of the branches is a free end;
wherein each of the branches has a plurality of grooves;
wherein the grooves in a first one of the branches and the grooves in a second one of the branches are oppositely arranged with respect to each other to support the first row of wafers or the second row of wafers; and
wherein the processing system further comprises:
a loading chamber for loading the first and second rows of wafers;
a conveying chamber for conveying the first and second rows of wafers;
one or more process reaction chambers for treating the first and second rows of wafers;
a turnover chamber in which the device is located; and
an unloading chamber for unloading the first and second rows of wafers.

25. The device of claim 12, further comprising one of the wafers.

\* \* \* \* \*